(12) United States Patent
Lee

(10) Patent No.: US 6,214,657 B1
(45) Date of Patent: Apr. 10, 2001

(54) SEMICONDUCTOR DEVICE ISOLATION STRUCTURE AND FABRICATION METHOD OF SEMICONDUCTOR DEVICE USING THE SAME

(75) Inventor: Seung Ho Lee, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/083,438

(22) Filed: May 22, 1998

(30) Foreign Application Priority Data

Jul. 31, 1997 (KR) .................................................. 97-36563

(51) Int. Cl.[7] .............................................. H01L 21/8238
(52) U.S. Cl. ........................ 438/219; 438/423; 438/528; 257/506
(58) Field of Search .................................... 438/219, 370, 438/423, 424, 528; 257/347, 348, 349, 350, 351, 352, 353, 354, 501

(56) References Cited

U.S. PATENT DOCUMENTS

| | | |
|---|---|---|
| 5,438,015 | 8/1995 | Lur . |
| 5,494,846 * | 2/1996 | Yamazaki ................................ 437/62 |
| 5,627,399 * | 5/1997 | Fujii ........................................ 257/501 |
| 5,696,020 * | 12/1997 | Ryum et al. ............................ 437/72 |
| 5,956,597 * | 9/1999 | Furukawa et al. .................... 438/405 |
| 6,057,214 * | 5/2000 | Joyner ................................... 438/506 |

\* cited by examiner

Primary Examiner—Sara Crane

(57) ABSTRACT

A semiconductor device isolation structure includes a semiconductor substrate including an active region and a field region, an insulation layer buried in the active region of the substrate, and an isolation layer formed in the field region of the substrate deeper than the buried insulation layer. A method for isolating a semiconductor device includes the steps of preparing a semiconductor substrate, defining an active region and a field region in the substrate, forming an insulation layer buried in the active region of the substrate, and forming an isolation layer in the field region of the substrate to be deeper than the buried insulation layer. The invention applies to an SOI (Silicon On Insulator) provided with a SIMOX (Separation by Implanted Oxygen) type, for effectively overcoming interfacial defects between a buried oxide film and a semiconductor substrate, and improves a reliability of the semiconductor device by planarizing the same.

11 Claims, 5 Drawing Sheets

SEMICONDUCTOR DEVICE ISOLATION STRUCTURE AND FABRICATION METHOD OF SEMICONDUCTOR DEVICE USING THE SAME

BACKGROUND OF THE INVENTION

1. Field of the Invention

The present invention relates to a semiconductor device isolation structure and a semiconductor device fabrication method using the same.

2. Description of the Prior Art

A junction isolation structure is not appropriate under high voltage and high radioactive environments. This is because a high voltage supply of about 30V may lead to a junction breakdown, and a photo-electric current generated in a pn junction by gamma rays may be transient under high radioactive environments. A SOI (Silicon On Insulator) technology is a device isolation method for entirely surrounding a semiconductor device with an insulator rather than adopting a pn junction isolation structure, enabling operation notwithstanding the existence of high voltage and high radioactive environments.

In the SOI technology, fabrication steps are more simplified than fabrication steps required for a circuit formed from bulk silicon. Furthermore, using the SOI technology, a latch-up is prevented in a CMOS (Complementary Metal Oxide Semiconductor) circuit. Still further, using the SOI technology, capacitive coupling between circuits is decreased in an identical semiconductor substrate, leading to a decrease in the semiconductor chip size.

U.S. Pat. No. 5,438,015 discloses an SOI related convention art using a buried air gap, which SOI technology will be described with reference to FIGS. 1A through 1D.

First, as shown in FIG. 1A, a field oxide film 31 is formed via a general LOCOS (LOCos Oxidation of Silicon) method. In the conventional art, the field oxide film 31 is preferably from about 3000 A to 10000 A in thickness.

As further shown in FIG. 1B, using the field oxide film 31 on the semiconductor substrate 30 as a mask, nitride ions are implanted into the substrate 30 at a density ranging from $1 \times 10^{18}$ to $2 \times 10^{18}$ atoms/cm$^2$ and an energy of 100~200 KeV. The resulting structure is then annealed for about 1 to 5 hours at a temperature ranging from 1100° C. to 1300° C. to form buried silicon nitride layers 32, whereby a plurality of active regions 33 are isolated by the buried silicon nitride layers 32 and the field oxide film 31.

Referring to FIG. 1C, a plurality of holes 34 are formed adjacent to edge portions, the holes being formed sufficiently deep to reach the buried silicon nitride layers 32. The semiconductor substrate 30 is then dipped into a hot phosphoric acid solvent, which has the characteristics of an etchant. When dipped, the solvent flows to the buried silicon nitride layers 32 through the holes 34 and etches those buried silicon nitride layers 32 to form buried gaps 35.

With reference to FIG. 1D, in order to carry out an annealing process and to compensate for possible defects in the semiconductor substrate 30, the holes 34 are filled with a silicon oxide material or a silicon nitride material via CVD (Chemical Vapor Deposition) method or a PVD (Physical Vapor Deposition) method. Reference numeral 36 denotes the silicon oxide material or the silicon nitride material which is stuffed in the holes 34. Then, the semiconductor substrate 30 is annealed at a temperature ranging from 900~1000° C. In addition, to improve a device isolation effect, a silicon oxide film may be formed in the buried gaps prior to filling the holes 34 therewith.

When the device isolation process is completed, devices such as a gate electrode, a source and a drain are formed on the active region 33.

However because such an SOI technique employs a LOCOS method, it has been difficult to overcome disadvantages that belong to the conventional device isolation technique employing a LOCOS method. That is, a bird's beak formation confines the decrease of the active regions, thereby deteriorating integration in the semiconductor device.

Further, because of the bird's beak phenomenon, the implanted depth becomes different depending on whether it is an edge portion or a central portion on the active region when nitride ions are implanted into the substrate for forming the buried insulator. The differentiated depths may cause a threshold voltage variation on the active region. Also, a stress-oriented defect may be encountered when the field oxide film is formed adjacent to the bird's beak in the substrate.

SUMMARY OF THE INVENTION

Accordingly, it is an object of the present invention to provide a semiconductor device isolation structure and a semiconductor device fabrication method using the same, which applies a SOI technique rather than a LOCOS method.

To achieve the above-described object, there is provided a semiconductor device isolation structure which includes a semiconductor substrate including an active region and a field region, an insulation layer buried in the active region of the substrate, and an isolation layer formed in the field region of the substrate deeper than the buried insulation layer.

Further, to achieve the above-described object, there is provided a method for isolating a semiconductor device which includes the steps of preparing a semiconductor substrate, defining an active region and a field region in the substrate, forming an insulation layer buried in the active region of the substrate, and forming an isolation layer in the field region of the substrate to be deeper than the buried insulation layer.

Still further, to achieve the above-described object, there is provided a semiconductor device according to the present invention which includes a semiconductor substrate including an active region and a field region, an insulation layer buried in the active region of the substrate, a trench isolation layer formed in the field region of the substrate to be deeper than the buried insulation layer, a gate insulation layer formed on the field region of the substrate, a gate electrode formed of a first conductive layer formed on an upper surface of the gate insulation layer, and an impurity region formed in the substrate and adjacent to each side of the gate electrode.

Also, to achieve the above-described object, the semiconductor device fabrication method according to the present invention includes the steps of sequentially stacking an oxide film and a nitride film on the substrate, defining an active region and a field region on the nitride film, forming a silicon nitride film pattern over the field region of the substrate, forming an insulation layer buried in the active region of the substrate, forming a gate insulation layer on the active region of the substrate, forming a first conductive layer on the gate insulation layer, forming a first insulation layer on the first conductive layer, forming a first conductive layer pattern by exposing the nitride film pattern and the first conductive layer therethrough, forming an oxide film by oxidizing the first conductive pattern, forming a trench in the field region of the substrate to be deeper the buried insulation layer, forming a second insulation layer on the trench and the oxide film, exposing the first conductive layer pattern, forming a second conductive layer on the first conductive layer, forming a word line by patterning the second conductive layer, forming a gate electrode by patterning the first conductive layer below the second conductive layer, and forming an impurity region in the semiconductor substrate and adjacent to each side of the gate electrode.

BRIEF DESCRIPTION OF THE DRAWINGS

The present invention will become more clearly understood with reference to the accompanying drawings, which are given only by way of illustration and which are therefore not limitative of the present invention, wherein.

DETAILED DESCRIPTION OF THE INVENTION

With reference to the accompanying drawings, the semiconductor device isolation structure and semiconductor device fabrication method using the same according to the present invention will now be described.

Figure 1A:
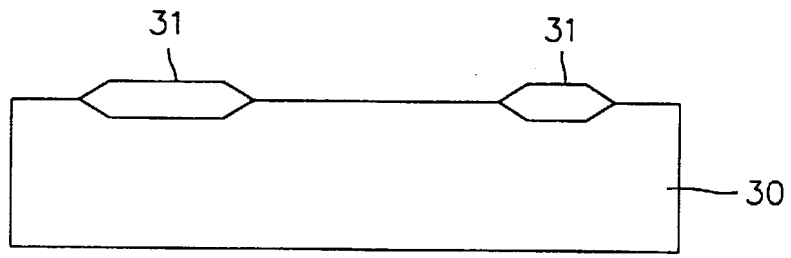
FIGS. 1A through 1D illustrates a process according to a conventional SOI fabrication method.
Figure 1B:
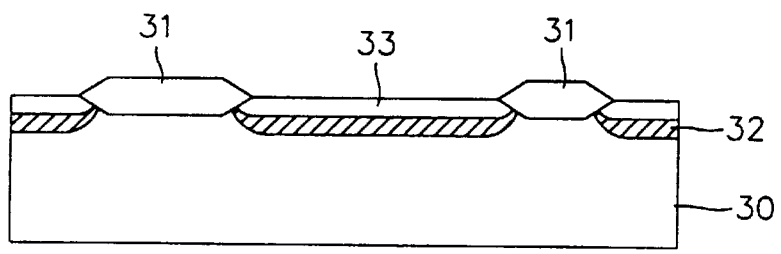
Figure 1C:
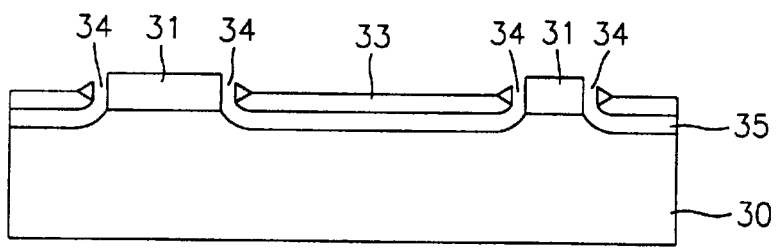
Figure 1D:
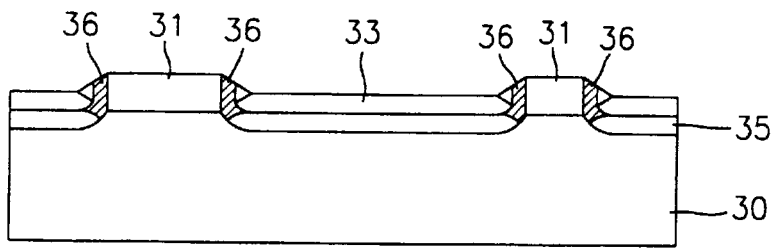
Figure 2A:
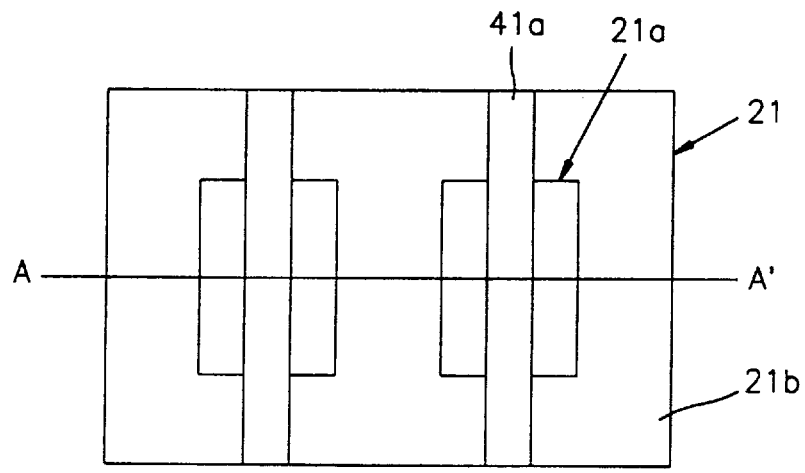
FIG. 2A is a plan view of a SOI structure according to the present invention.
Figure 2B:
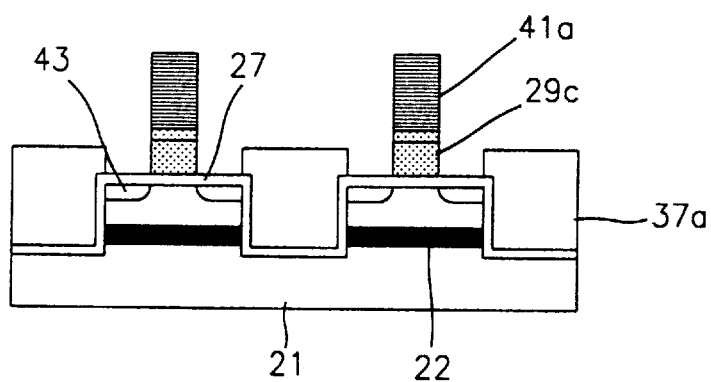
FIG. 2B is a cross-sectional view taken along line A–A' in FIG. 2A.

FIG. 2A is a plan view of a SOI structure according to the present invention, and FIG. 2B is a cross-sectional view taken along line A–A' in FIG. 2A. As shown therein, a semiconductor substrate 21 includes an active region 21a and a field region 21b, wherein the field region 21b surrounds the active region 21a. Also, a word line 41a is formed on the respective upper surfaces of the active region 21a and the field region 21b.

As shown in FIG. 2B, a plurality of isolators 37a are formed on the field region 21b, horizontally partitioning the semiconductor device. An insulation layer 22 is formed below the active region 21a of the semiconductor substrate 21, vertically partitioning the semiconductor device. A semiconductor device is formed on the active region 21a, which active region is surrounded by the field region 21b. A gate insulation layer 27 is formed on the upper surface of the semiconductor substrate 21. A gate electrode 29c is formed on the gate insulation layer 27. On the gate electrode 29c there is formed a word line 41a, connecting the gate electrode 29c formed over the semiconductor substrate 21. Adjacent to each edge of the gate electrode 29c and in the upper surface of the substrate 21, there are formed impurity regions 43.

The method for fabricating the above-described semiconductor device isolation structure will now be described with reference to FIGS. 3A through 3J.

Figure 3A:
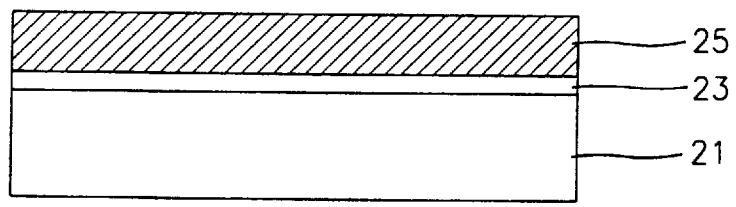
FIGS. 3A through 3J are cross-sectional process views illustrating a semiconductor device fabrication method according to the present invention.

First, as shown in FIG. 3A, on the semiconductor substrate 21, oxide film 23 and a nitride film 25 are sequentially formed, wherein the oxide film 23 is formed by thermal oxidation to range from 100~300 A in thickness. The nitride film 25 is deposited in a thickness ranging from 1000~2500 A.

Figure 3B:
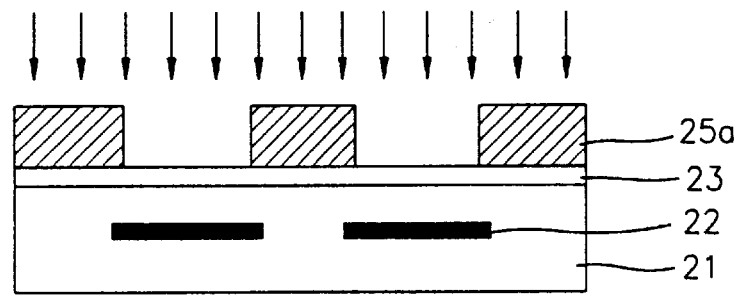

As further shown in FIG. 3B, using a photoresist film (not shown), an active region and a field region are defined on the nitride film 25, and the portion of the nitride film 25 corresponding to the active region are selectively removed so as to form a nitride film pattern 25a. Using the nitride film pattern as a mask, oxygen ions are implanted into the semiconductor substrate 21 at an energy of 120~200 KeV and at a density of $3\times10^{17}$~$1\times10^{18}$ atoms/cm$^2$. Then, the substrate 21 is annealed for 4 to 6 hours at a temperature ranging from 1000~1370° C., thereby forming a buried oxide layer 22.

Figure 3C:
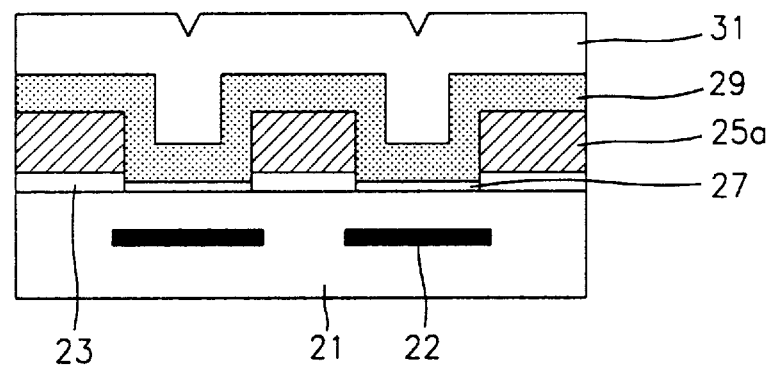

Referring to FIG. 3C, the portion of the oxide film 23 corresponding to the active region is removed using a HF or BOE solution. A gate insulation film 27 is then formed on the active region of the substrate 21. In order to form the gate insulation film 27, the semiconductor substrate 21 is subject to oxynitride depostion or thermal oxidation for forming an oxide film.

Figure 3D:
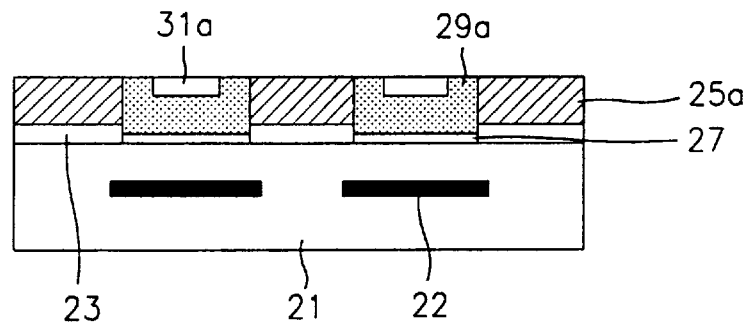

A doped polysilicon layer 29, serving as a first conductive layer, is formed on the gate insulation layer 27 and the nitride film pattern 25a. The polysilicon layer 29 forms a gate electrode in a later process. A doped polysilicon layer may also be employed for lowering a resistance. On the upper surface of the polysilicon layer 29, also a silicon oxide ($SiO_2$) film 31 is formed using a CVD method. The silicon oxide film 31 serves as a first insulation layer. Next, using a CMP (Chemical Mechanical Polishing) method, the respective patterns on the substrate 21 are polished to expose the upper surface of the nitride film pattern 25a and to planarize the top surface of the substrate 21 to expose, the nitride film pattern 25a, the polysilicon layer pattern 29a and the first insulation layer pattern 31a, as shown in FIG. 3D.

Figure 3E:
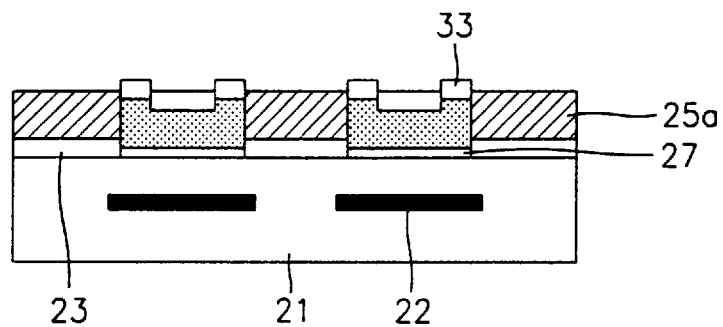

With reference to FIG. 3E, an oxide film 33 is formed by oxidizing the polysilicon layer pattern 29a. The oxide film 33 serves as a mask layer (protection layer) for preventing the polysilicon layer pattern 29a from being etched by increasing an etching selectivity between the oxide film 33 and the substrate 21, when a trench is formed in later fabrication steps by etching the substrate 21 that is formed by silicon.

Figure 3F:
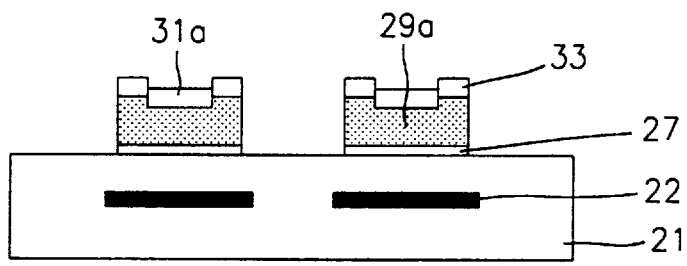

In FIG. 3F, the nitride film pattern 25a and the oxide film 23 are sequentially etched by an anisotropical etching method.

Figure 3G:
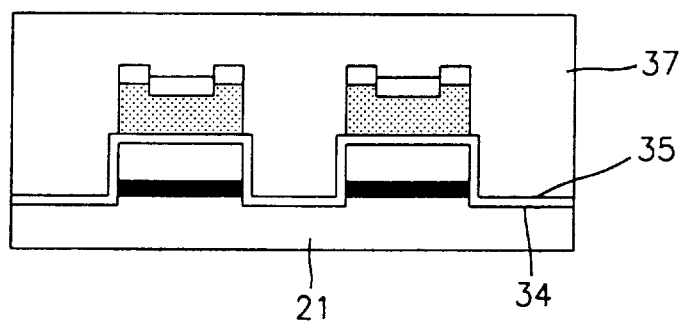
Figure 3H:
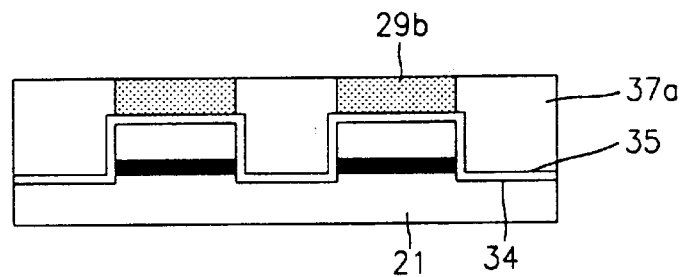

As shown in FIG. 3G, using the oxide film 33 and the first insulation layer pattern 31a formed on the polysilicon layer pattern 29a respectively as a mask, the substrate 21 is etched to a deeper extent than the buried insulation layer 22 so as to form the trench 34. In order to form the trench 34, a complete anisotropical etching is conducted while a bias is applied to a bottom surface of the substrate through a chuck supporting the substrate 21.

On a side and bottom of the trench, there is formed a buffer oxide film 35 having a thickness of 50~200 A. The buffer oxide film 35 is formed in the trench 34 to recover defects incurred in the substrate 21 during an etching process used to form the trench 34. The isolation of the semiconductor device is completed through the fabrication steps shown in FIGS. 3A through 3F. Then, the semiconductor device fabrication steps are sequentially carried out.

As shown in FIG. 3G, a second insulation layer 37 is formed on the buffer oxide film 35, the oxide film 33 and the first insulation layer pattern 29a. As further shown in FIG. 3H, a chemical mechanical polishing process is carried out against the second insulation layer 37. In the polishing process, the upper surface of the polysilicon layer pattern 29a provided below the first insulation layer pattern 31a is exposed causing the top surface of the substrate 21 to be planarized. Simultaneously, the second insulation layer pattern 37a and the polysilicon layer pattern 29b are formed. The second insulation layer pattern 37a is an isolation layer that isolates the semiconductor device horizontally.

Figure 3I:
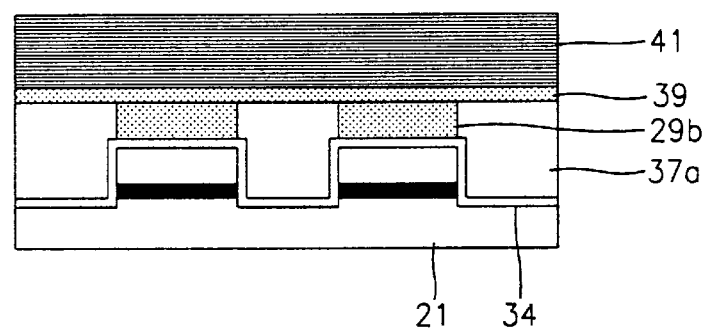
Figure 3J:
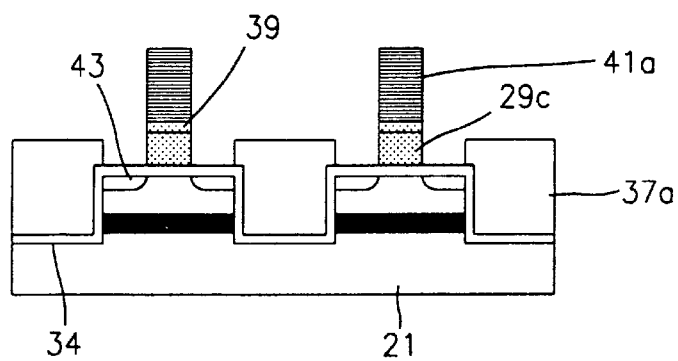

Referring to FIG. 3I, a polysilicon layer 39 is formed on the upper surface of the polysilicon layer pattern 29b and the second insulation layer pattern 37a. The polysilicon 39 formation for planarization is carried out to compensate for excessive thinning of the polysilicon layer during a chemical mechanical polishing method. Therefore, the polysilicon layer pattern 39 may not be necessary when the thickness of the polysilicon layer pattern 29b, which is to be removed through the chemical mechanical polishing method, is precisely controlled to more than a predetermined thickness after forming the polysilicon layer 29 serving as the first conductive layer. However, because it is difficult to precisely control the height of the polysilicon layer pattern 29b through the chemical mechanical polishing method, height controlling of the polysilicon layer by additionally depositing the polysilicon layer 39 is recommended. The polysilicon layer 39 and the polysilicon layer pattern 29b are then patterned to form a gate electrode. Next, on the upper surface of the polysilicon layer 39 there is formed a metallic layer 41 serving as the second conductive layer, such as a tungsten silicide. The metallic layer 41 is also patterned in a later process to form a word line that is connected to the gate electrode. That is, as shown in FIG. 3J, after forming the second conductive layer 41, the second conductive layer 41 is patterned so as to form a word line 41a, and the polysilicon layer pattern 29b is patterned to form a gate electrode 29c. Using the word line 41a as a mask, impurity ions are implanted into the active region of the substrate 21 for thereby completing the semiconductor device fabrication having an impurity region 43, that is, a source and a drain region.

As described above, when a semiconductor device is fabricated using the device isolation structure according to the present invention, a trench structure device isolation is carried out for thereby improving an integration of the semiconductor device.

Further, the present invention overcomes a disadvantage of the conventional art in which device reliability has been deteriorated by the thinner gate oxide film in accordance with a ready formation of the gate oxide film on the active region of the substrate, prior to forming the trench, for thereby improving the device reliability.

Still further, because a field oxide film is not required, a stress that tends to be generated during the field oxide film formation does not occur in the substrate for thereby obtaining a high quality semiconductor substrate.

Also, the gate electrode and word line patterns are formed in a state in which the substrate is entirely polished more than two times by the chemical mechanical polishing process, thereby overcoming a pattern notching problem which occurs when a pattern is formed on the unplanarized substrate.

What is claimed is:

1. A method for isolating a semiconductor device, comprising:
   preparing a semiconductor substrate;
   defining an active region and a field region in the substrate;
   forming an insulation layer buried in the active region of the substrate; and
   forming an isolation layer in the field region of the substrate at a level that is deeper than the buried insulation layer, said forming an isolation layer further comprising:
   sequentially stacking an oxide film and a nitride film on the substrate;
   selectively removing the nitride film over the active region and forming a nitride film pattern over the field region; and
   implanting oxygen ions into the substrate using the nitride film pattern formed over the field region as a mask.

2. The method recited by claim 1, wherein the formation of the insulation layer buried in the active region of the substrate further comprises:
   annealing the substrate after implanting oxygen ions for about four to six hours at a temperature ranging from 1000~1370° C.

3. A semiconductor device fabrication method, comprising:
   sequentially stacking an oxide film and a nitride film on the substrate;
   defining an active region and a field region on the nitride film;
   forming a nitride film pattern over the field region of the substrate;
   forming an insulation layer buried in the active region of the substrate;
   forming a gate insulation layer on the active region of the substrate;
   forming a first conductive layer on the gate insulation layer;
   forming a first insulation layer on the first conductive layer;
   forming a first conductive layer pattern by exposing the nitride film pattern and the first conductive layer therethrough;
   forming an oxide film by oxidizing the first conductive layer pattern;
   forming a trench in the field region of the substrate that is deeper than the buried insulation layer;
   forming a second insulation layer on the trench and the oxide film;
   exposing the first conductive layer pattern;
   forming a second conductive layer on the first conductive layer;
   forming a word line by patterning the second conductive layer;
   forming a gate electrode by patterning the first conductive layer below the second conductive layer; and
   forming an impurity region in the semiconductor substrate and adjacent to each side of the gate electrode.

4. The method recited by claim 3, wherein the exposing of the nitride film pattern and the first conductive layer includes using a chemical mechanical polishing method.

5. The method recited by claim 3, wherein the forming of the trench on the filed region of the substrate includes:
   performing a complete anisotropical etching, and
   applying a bias into the semiconductor substrate through a chuck supporting the semiconductor substrate.

6. The method recited by claim 3, wherein the forming of the buried insulation layer in the active region of the substrate includes:
   inplanting oxygen ions into the active region of the substrate using the nitride pattern as a mask.

7. The method recited by claim 3, further comprising:
   forming a conductive layer made of a material similar to that of the first conductive layer on the first conductive layer pattern after exposing the first conductive pattern.

8. The method recited by claim 3, wherein the first conductive layer is formed of polysilcon.

9. The method recited by claim 3, wherein the second conductive layer is formed of a metallic material.

10. The method recited by claim 3, wherein the second conductive layer is formed of tungsten silicide.

11. The method recited claim 3, wherein the exposing of the first conductive layer pattern includes performing a chemical mechanical polishing process.

* * * * *